(12) United States Patent
Shiratori et al.

(10) Patent No.: US 9,972,804 B2
(45) Date of Patent: May 15, 2018

(54) LIGHT EMITTING ELEMENT, LIGHT EMITTING DEVICE, AND ELECTRONIC APPARATUS

(71) Applicant: SEIKO EPSON CORPORATION, Tokyo (JP)

(72) Inventors: Koya Shiratori, Matsumoto (JP); Yuki Hanamura, Azumino (JP); Tsutomu Asakawa, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days. days.

(21) Appl. No.: 15/452,089

(22) Filed: Mar. 7, 2017

(65) Prior Publication Data

US 2017/0279068 A1    Sep. 28, 2017

(30) Foreign Application Priority Data

Mar. 28, 2016  (JP) ................................. 2016-063257

(51) Int. Cl.
| | | |
|---|---|---|
| *H01L 51/52* | (2006.01) | |
| *H01L 27/32* | (2006.01) | |
| *H01L 51/50* | (2006.01) | |

(52) U.S. Cl.
CPC ........ *H01L 51/5212* (2013.01); *H01L 27/322* (2013.01); *H01L 27/3211* (2013.01); *H01L 51/50* (2013.01); *H01L 51/5084* (2013.01); *H01L 51/5203* (2013.01); *H01L 51/5253* (2013.01); *H01L 51/5259* (2013.01)

(58) Field of Classification Search
CPC . H01L 51/50; H01L 51/5048; H01L 51/5072; H01L 51/5076; H01L 51/508; H01L 51/5084; H01L 51/5088; H01L 51/5092; H01L 51/5203; H01L 51/5206; H01L 51/5212; H01L 51/5215; H01L 51/5237
See application file for complete search history.

(56) References Cited

U.S. PATENT DOCUMENTS

| | | | |
|---|---|---|---|
| 2004/0081852 A1* | 4/2004 | Chen | H01L 51/5253 |
| | | | 428/690 |
| 2005/0099113 A1 | 5/2005 | Yamada | |
| 2010/0051973 A1 | 3/2010 | Kobayashi et al. | |
| 2010/0051991 A1 | 3/2010 | Shiratori et al. | |
| 2013/0285537 A1* | 10/2013 | Chaji | H01L 27/322 |
| | | | 313/504 |

(Continued)

FOREIGN PATENT DOCUMENTS

| | | |
|---|---|---|
| JP | 2003-109775 A | 4/2003 |
| JP | 2010-055919 A | 3/2010 |

(Continued)

*Primary Examiner* — Eduardo A Rodela
(74) *Attorney, Agent, or Firm* — Oliff PLC

(57) ABSTRACT

An organic EL element includes a pixel electrode, a light emitting function layer that is formed on the pixel electrode, an electron injection layer formed on the light emitting function layer, and a counter electrode that is formed on the electron injection layer and that has semi-transmissive reflectivity, in which the counter electrode contains a reductive material that reduces material of the electron injection layer and Ag with atomic ratio of 75% or more, and an adsorption layer is formed on the counter electrode.

16 Claims, 10 Drawing Sheets

(56) References Cited

U.S. PATENT DOCUMENTS

| | | | | |
|---|---|---|---|---|
| 2014/0001456 A1* | 1/2014 | Mizutani | ............... | C07D 405/14 |
| | | | | 257/40 |
| 2014/0081852 A1* | 3/2014 | Blackhurst | ............. | G06Q 20/14 |
| | | | | 705/40 |
| 2015/0228930 A1* | 8/2015 | Murata | ............... | H01L 51/5271 |
| | | | | 257/88 |
| 2015/0333272 A1* | 11/2015 | Ozeki | .................... | H05B 33/28 |
| | | | | 428/457 |
| 2016/0155782 A1* | 6/2016 | Sato | .................... | H01L 27/3227 |
| | | | | 257/82 |

FOREIGN PATENT DOCUMENTS

| | | |
|---|---|---|
| JP | 2010-056211 A | 3/2010 |
| JP | 2010-129334 A | 6/2010 |
| JP | 2010-141285 A | 6/2010 |
| JP | 5411469 B2 | 2/2014 |
| JP | 5613998 B2 | 10/2014 |

\* cited by examiner

FIG. 6

| | COMPARATIVE EXAMPLE 1 | COMPARATIVE EXAMPLE 2 | EXAMPLE 1 | EXAMPLE 2 | EXAMPLE 3 | EXAMPLE 4 | EXAMPLE 5 | EXAMPLE 6 | EXAMPLE 7 |
|---|---|---|---|---|---|---|---|---|---|
| ELECTRON INJECTION LAYER | N/A | LiF + Mg (1nm) | | | | | | | |
| COUNTER ELECTRODE | Ag:Mg=1:10 (15nm) | Ag:Mg=10:1 (15nm) | | | | | | | |
| ADSORPTION LAYER | N/A | N/A | Mg (0.5nm) | Mg (1nm) | Mg (2nm) | Mg (3nm) | Mg (5nm) | Mg (8nm) | Mg (10nm) |
| RELATIVE LUMINANCE (COMPARATIVE EXAMPLE 1 REFERENCE) | 1 | 1.76 | 1.74 | 1.72 | 1.51 | 1.43 | 1.31 | 1.05 | 0.87 |
| HIGH-TEMPERATURE TEST (PIXEL SHRINK GENERATION TIME) | — | 230 | 450 | — | — | — | — | — | — |

LIGHT EMITTING ELEMENT, LIGHT EMITTING DEVICE, AND ELECTRONIC APPARATUS

BACKGROUND

1. Technical Field

The present invention relates to a light emitting element, a light emitting device, and an electronic apparatus.

2. Related Art

Since it is possible for an organic EL element as a light emitting element to be miniaturized or thinned in comparison to a light emitting diode (LED), application has been observed of a micro display such as a head mounted display (HMD) or an electronic view finder (EVF). In such a micro display, in order to improve brightness, a configuration is suggested in which a main component of an electrode (second electrode) on a side to which light is extracted is Ag (for example, refer to Japanese Patent No. 5411469).

Meanwhile, when the second electrode that has Ag as a main component is used, there is a concern that concavities and convexities are generated in the second electrode due to aggregation of Ag atoms, and the second electrode is damaged due to stress being applied to the concavities and convexities according to a load from an inorganic compound film that is formed on an upper layer. Therefore, a configuration is suggested in which a stress mitigation layer is disposed between the second electrode that has Ag as the main component and the inorganic compound film in order to mitigate stress to the second electrode (for example, refer to Japanese Patent No. 5613998).

However, when moisture or oxygen that is present within the light emitting device infiltrates the second electrode since Ag is extremely rich in reactivity, Ag contained in the second electrode reacts with moisture or oxygen. For example, when moisture or oxygen infiltrates the second electrode from an outer periphery portion of the pixel and spreads up to a light emission region, a light emission area of the organic EL element becomes small due to the Ag reaction, and as a result, leads to reduction of brightness. Such temporal reduction of brightness tends to occur since the more compact and high-definition the light emitting device, the more moisture or oxygen tends to spread up to the light emission region. That is, when content of Ag contained in the second electrode is high in order to improve brightness of the organic EL element, there is a problem in that there is a concern that influence tends to be received due to reaction of Ag with moisture or oxygen and leads to deterioration of a light emission characteristic and reliability quality reduction in light emission life.

SUMMARY

The invention can be realized in the following aspects or application examples.

Application Example 1

According to this application example, there is provided a light emitting element including a first electrode, a light emitting function layer that is formed on the first electrode, an electron injection layer formed on the light emitting function layer, and a second electrode that is formed on the electron injection layer and that has semi-transmissive reflectivity, in which the second electrode contains a reductive material that reduces material of the electron injection layer and Ag with atomic ratio of 75% or more, and an adsorption layer is formed on the second electrode.

According to the configuration of the light emitting element of the application example, electron injection is improved while light extraction efficiency is improved since the second electrode contains Ag with atomic ratio of 75% or more. Then, deterioration of power supply performance by reducing film quality due to aggregation of Ag atoms is suppressed since the second electrode contains the reductive material in addition to Ag. Accordingly, in the second electrode, both improvement of optical characteristics as a semi-transmissive reflective film in which brightness is improved and an improvement of electrical characteristics as an electrode are possible. In addition, it is possible to suppress infiltration of moisture or oxygen to the second electrode that contains Ag by adsorbing moisture or oxygen that infiltrates from outside of the light emitting element in the adsorption layer formed on the second electrode. As a result, it is possible to improve brightness and reliability quality of the light emitting element.

Application Example 2

In the light emitting element according to the application example, it is preferable that a material of the adsorption layer be the same material as the reductive material.

According to the configuration of the application example, it is possible to configure the light emitting element of less material.

Application Example 3

In the light emitting element according to the application example, it is preferable that the material of the adsorption layer be Mg or Al.

According to the configuration of the application example, it is possible to effectively suppress infiltration of moisture or oxygen from outside to the second electrode in the adsorption layer since the material of the adsorption layer is Mg or Al that tends to react with moisture or oxygen. In addition, it is possible to suppress aggregation of Ag atoms by containing Mg or Al in the second electrode as the reductive material.

Application Example 4

In the light emitting element according to the application example, it is preferable that a light absorption rate of the adsorption layer be 30% or less.

According to the configuration of the application example, it is possible to suppress light extraction efficiency reduction to be small due to providing the adsorption layer by setting the light absorption rate of the adsorption layer to 30% or less.

Application Example 5

In the light emitting element according to the application example, it is preferable that a thickness of the adsorption layer be 1 nm or more.

According to the configuration of the application example, it is possible to more reliably suppress infiltration of moisture or oxygen from outside of the light emitting element to the second electrode due to the thickness of the adsorption layer being 1 nm or more.

Application Example 6

In the light emitting element according to the application example, it is preferable that the thickness of the adsorption layer be thinner than a thickness of the second electrode.

According to the configuration of the application example, it is possible to suppress light extraction efficiency reduction to be small while suppressing moisture or oxygen that infiltrates from outside of the light emitting element from reaching the second electrode by setting the thickness of the adsorption layer to be thinner than the thickness of the second electrode.

Application Example 7

In the light emitting element according to the application example, it is preferable that Ag which is contained in the second electrode have atomic ratio of 98% or less.

Although it is possible to improve brightness of the light emitting element as the amount of Ag contained in the second electrode is great, power supply performance deteriorates due to film quality being reduced when content of Ag is too great. According to the configuration of the application example, it is possible to improve optical characteristics in a range in which electrical characteristics of the second electrode is not deteriorated since Ag that is contained in the second electrode has atomic ratio of 98% or less.

Application Example 8

According to this application example, there is provided a light emitting device, in which the light emitting element described above is provided in each pixel and a sealing layer is provided that is formed to cover the light emitting element.

According to the configuration of the light emitting device of the application example, it is possible to provide the light emitting device which is bright and has superior reliability quality since infiltration of moisture or oxygen from outside to the light emitting element is suppressed by the sealing layer.

Application Example 9

In the light emitting device according to the application example, it is preferable that the sealing layer include a first sealing layer, a flattening layer made from an organic material that is laminated on the first sealing layer, and a second sealing layer that is laminated on the flattening layer.

According to the configuration of the application example, it is possible to more reliably suppress infiltration of moisture or oxygen from outside since there is a configuration in which the sealing layer has three layers including the flattening layer. Note that, even in the unlikely event of a case where cracks are generated in the first sealing layer and moisture or oxygen that is contained in the flattening layer infiltrates up to the light emitting element, it is possible to suppress moisture or oxygen from reaching the second electrode using the adsorption layer.

Application Example 10

In the light emitting device according to the application example, arrangement pitch of the pixels may be 10 μm or less.

In a high-definition light emitting device with a pixel arrangement pitch of 10 μm or less, the light emission region in each pixel is small in comparison to a light emitting device in which the pixel arrangement pitch is larger. Therefore, when moisture or oxygen infiltrates and reacts with Ag of the second electrode, a phenomenon tends to occur in which an area of a part that substantially emits light within the light emission region is small and is darkened. According to the configuration of the application example, it is possible to provide the light emitting device which is bright and has superior reliability quality even in a high-definition light emitting device with a pixel arrangement pitch of 10 μm or less since it is possible to suppress infiltration of moisture or oxygen from outside to the second electrode using the sealing layer and the adsorption layer.

Application Example 11

According to this application example, there is provided an electronic apparatus including the light emitting device described in the application examples above.

According to the configuration of the application example, it is possible to provide the electronic apparatus that has superior display quality and reliability quality.

BRIEF DESCRIPTION OF THE DRAWINGS

The invention will be described with reference to the accompanying drawings, wherein like numbers reference like elements.

FIG. 6 is a table illustrating a configuration and test results of examples and comparative examples.

DESCRIPTION OF EXEMPLARY EMBODIMENTS

Embodiments which embody the invention will be described below with reference to the drawings. Note that, the drawings which are used are displayed by appropriately enlarging and shrinking such that the portion which is described is in a recognizable state.

Note that, in the embodiments below, for example, a case where "on a substrate" is described, if there is no specific description, disposing so as to come into contact on the substrate, a case of disposing on the substrate via another construction, a case of disposing a portion so as to come into contact on the substrate, or a case where a portion is disposed via another component are included.

First Embodiment

Light Emitting Device

Figure 1:
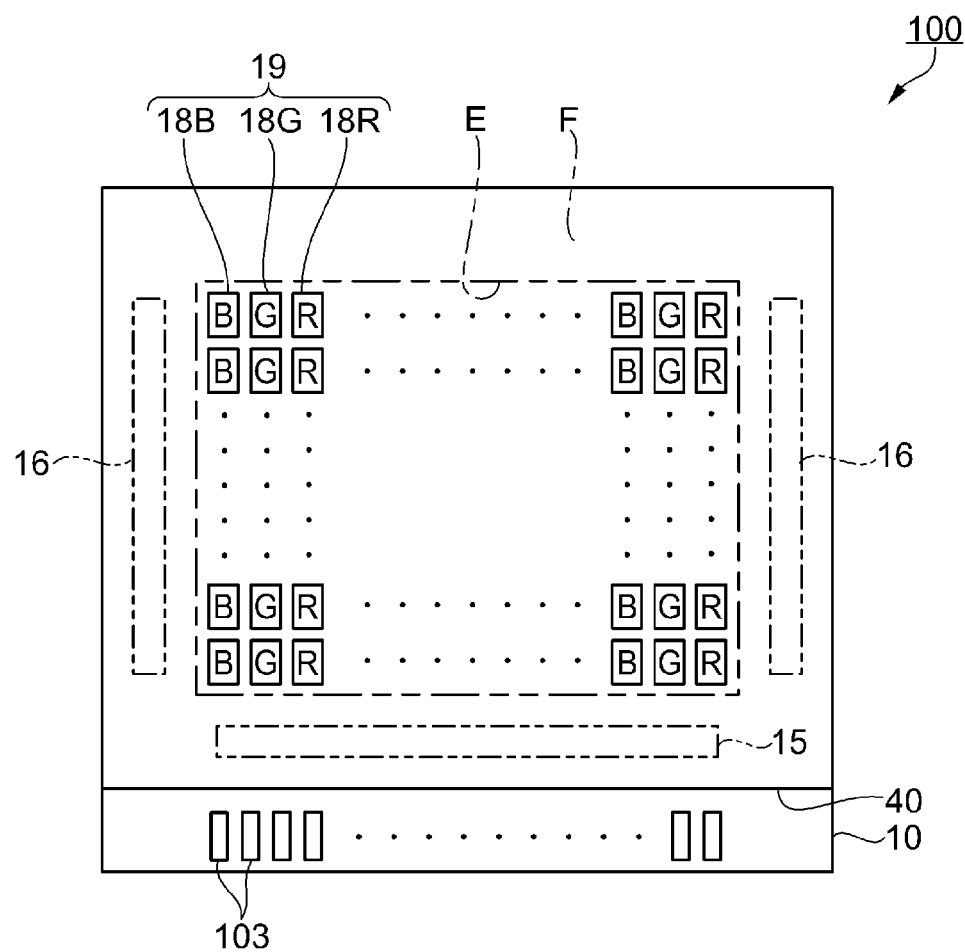
FIG. 1 is a schematic planar view illustrating a configuration of an organic EL apparatus according to a first embodiment.
Figure 2:
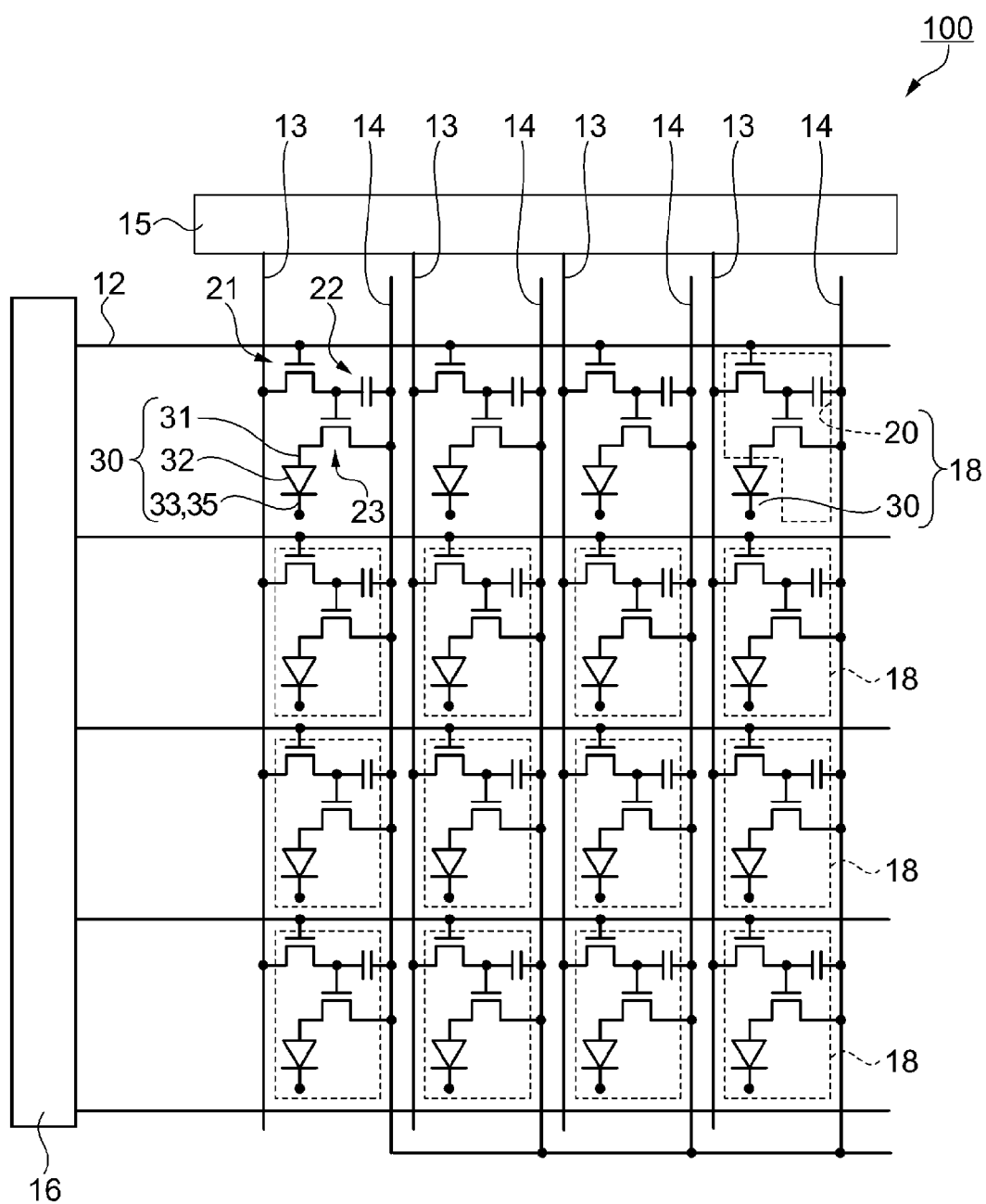
FIG. 2 is a equivalent circuit schematic illustrating an electrical configuration of the organic EL apparatus according to the first embodiment.
Figure 3:
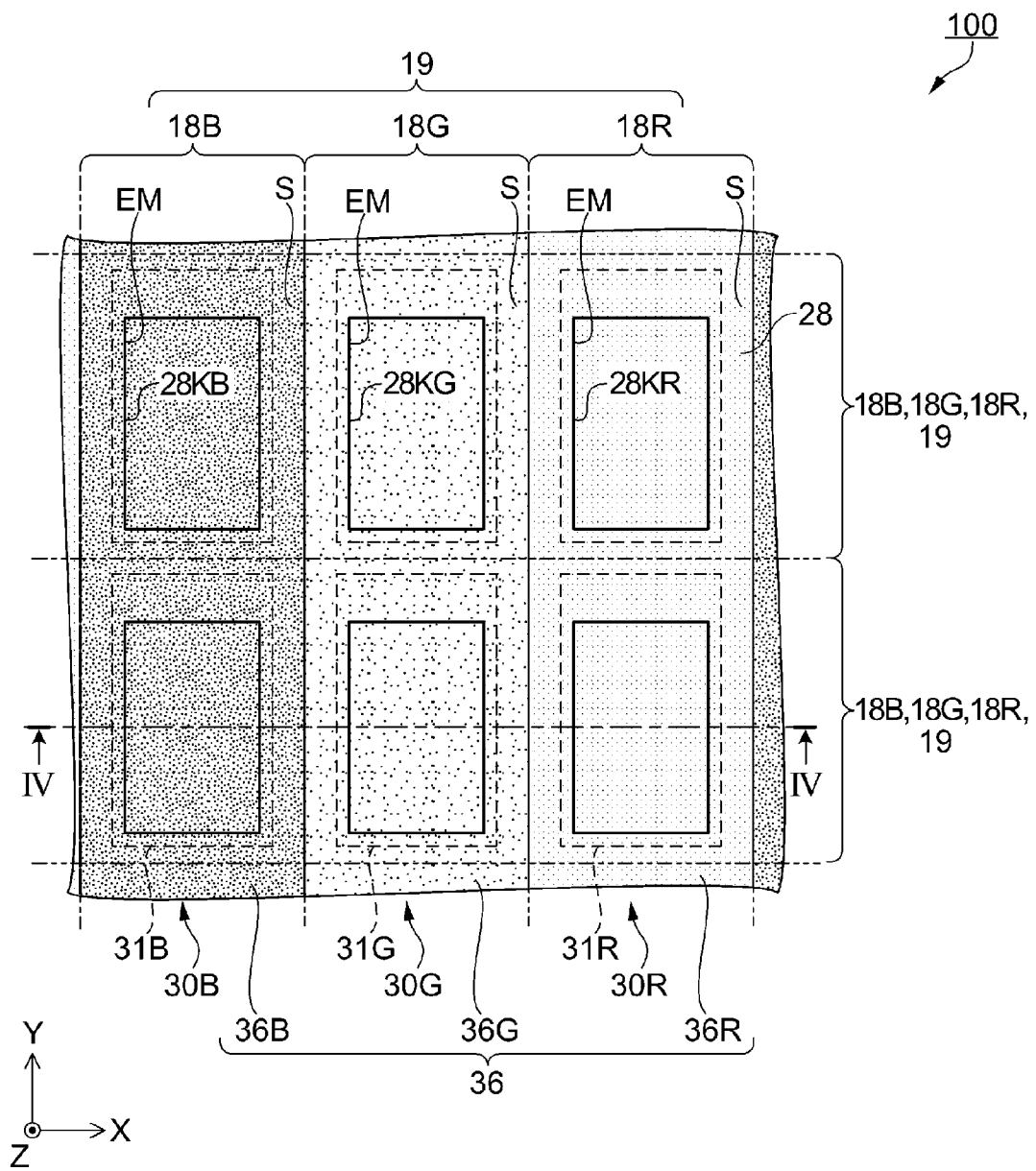
FIG. 3 is a schematic planar view illustrating an arrangement of organic EL elements in sub pixels.

First, an organic EL apparatus is described with reference to FIGS. 1 to 3 as a light emitting device according to a first embodiment. FIG. 1 is a schematic planar view illustrating a configuration of the organic EL apparatus according to the first embodiment. FIG. 2 is a equivalent circuit schematic illustrating an electrical configuration of the organic EL apparatus according to the first embodiment. FIG. 3 is a schematic planar view illustrating an arrangement of organic EL elements in sub pixels. An organic EL apparatus 100 according to the embodiment is a suitable self-luminous micro display in a display portion of a head mounted display (HMD) described above.

Light Emitting Device Structure

As shown in FIG. 1, the organic EL apparatus 100 as the light emitting device according to the embodiment has an element substrate 10 and a protective substrate 40. Both substrates are adhered disposed opposite a filler 42 (refer to FIG. 4).

The element substrate 10 has a display region E and a non-display region F that surrounds the display region E. A sub pixel 18B that generates blue (B) light, a sub pixel 18G that generates green (G) light, and a sub pixel 18R that generates red (R) light are arranged in the display region E, for example, in a matrix shape. The organic EL apparatus 100 is provided with a full color display in which a pixel 19 that includes the sub pixel 18B, the sub pixel 18G, and the sub pixel 18R is the display unit.

Note that, in the description below, the sub pixel 18B, the sub pixel 18G, and the sub pixel 18R may be collectively referred to as sub pixel 18. The display region E is a region in which light that is generated from the sub pixel 18 is transmitted and contributes to display. The non-display region F is a region in which light that is generated from the sub pixel 18 is not transmitted and does not contribute to display.

The element substrate 10 is larger than the protective substrate 40, and a plurality of external connection terminals 103 are arranged along a first side of the element substrate 10 that protrudes from the protective substrate 40. A data line driving circuit 15 is provided between the plurality external connection terminals 103 and the display region E. A scanning line driving circuit 16 is provided between other second side and third side which face each other orthogonal to the first side, and the display region E.

The protective substrate 40 is smaller than the element substrate 10, and is disposed such that the external connection terminals 103 are exposed. The protective substrate 40 is a substrate with light transmissivity, and for example, is able to use a quartz substrate, a glass substrate, or the like. In the display region E, the protective substrate 40 has a role such that an organic EL element 30 (refer to FIG. 2) disposed in sub pixel 18 described above is not damaged, and is disposed so as to face at least the display region E. A top emission system is adopted in the organic EL apparatus 100 of the embodiment in which light that is generated from sub pixel 18 is extracted from the protective substrate 40 side.

In the description below, the direction along the one side section along which the external connection terminals 103 are arranged is described as an X direction, and the direction along the other two side sections (second side and third side) which face each other orthogonal to the one side section described as a Y direction. The direction from the element substrate 10 toward the protective substrate 40 is a Z direction. In addition, a view from the protective substrate 40 side along the Z direction is referred to as "planar view".

In the embodiment, in the display region E, sub pixels 18 that obtain light emission of the same color are arranged in a column direction (Y direction), sub pixels 18 that obtain light emission of different colors are arranged in a row direction (X direction), and an arrangement of sub pixels 18 of a so-called stripe method is adopted. The sub pixel 18 has the organic EL element 30 and a color filter 36 (refer to FIG. 3 or FIG. 4). A detailed configuration of the organic EL element 30 and the color filter 36 will be described.

Note that, in FIG. 1, arrangement of the sub pixels 18B, 18G, and 18R in the display region E is indicated, but the arrangement of the sub pixels 18 in the row direction (X direction) is not particularly limited to the order of B, G, R. For example, the order may be G, B, R. In addition, arrangement of the sub pixels 18 is not limited to the stripe method, may be a delta method, a Bayer method, and an S stripe method, and additionally, the shape and size of the sub pixels 18B, 18G, and 18R are not limited to being the same.

Light Emitting Device Electrical Configuration

As shown in FIG. 2, the organic EL apparatus 100 has scanning lines 12, data lines 13, and power supply lines 14 which intersect with each other. The scanning lines 12 are electrically connected to the scanning line driving circuit 16, and the data lines 13 are electrically connected to the data line driving circuit 15. In addition, the sub pixels 18 are provided in the region that is partitioned by the scanning lines 12 and the data lines 13.

The sub pixel 18 has the organic EL element 30 as the light emitting element, and the pixel circuit 20 which controls driving of the organic EL element 30. Hereinafter, the organic EL element 30 that is disposed on the sub pixel 18B is referred to as an organic EL element 30B, the organic EL element 30 that is disposed on the sub pixel 18G is referred to as an organic EL element 30G, and the organic EL element 30 that is disposed on the sub pixel 18R is referred to as an organic EL element 30R.

The organic EL element 30 includes a pixel electrode 31 as the first electrode, a light emitting function layer 32, an electron injection layer 33, and a counter electrode 35 as the second electrode. The pixel electrode 31 functions as a positive electrode that injects a positive hole in the light emitting function layer 32. The counter electrode 35 functions as a negative electrode that injects electrons in the light emitting function layer 32. The electron injection layer 33 is a layer that has a function of increasing electron injection efficiency from the counter electrode 35 to the light emitting function layer 32.

In the light emitting function layer 32, an exciton (an exciton or a state in which the positive hole and the electron are tethered to each other using Coulomb force) is formed using the injected positive hole and electrons, and a part of energy is released as fluorescence or phosphorescence when the exciton is extinguished (when the positive hole and the electrons are recombined). In the embodiment, the light emitting function layer 32 is configured to obtain white emitted light from the light emitting function layer 32.

The pixel circuit 20 includes a switching transistor 21, a storage capacitor 22, and a driving transistor 23. Two transistors 21 and 23 are able to be configured using, for example, an n channel type or a p channel type transistor.

A gate of the switching transistor 21 is electrically connected to the scanning lines 12. A source of the switching transistor 21 is electrically connected to the data lines 13. A drain of the switching transistor 21 is electrically connected to the gate of the driving transistor 23.

The drain of the driving transistor 23 is electrically connected to the pixel electrode 31 of the organic EL element 30. A source of the driving transistor 23 is electrically connected to the power supply lines 14. The storage capacitor 22 is electrically connected between the gate of the driving transistor 23 and the power supply lines 14.

When the scanning lines 12 are driven and the switching transistor 21 is switched to an ON state using a control signal that is supplied from the scanning line driving circuit 16, potential is held in the storage capacitor 22 via the switching transistor 21 based on an image signal that is supplied from the data line 13. The ON and OFF state of the driving transistor 23 is determined according to a potential of the storage capacitor 22, that is, a gate potential of the driving transistor 23. Then, when the driving transistor 23 is switched to the ON state, current of an amount according to the gate potential flows from the power supply line 14 to the organic EL element 30 via the driving transistor 23. The organic EL element 30 emits light at luminance according to the amount of current that flows to the light emitting function layer 32.

Note that, a configuration of the pixel circuit 20 is not limited to having two transistors 21 and 23, and for example, may be further provided with a transistor for controlling current that flows in the organic EL element 30.

Light Emitting Element Arrangement in Sub Pixel

Next, the arrangement of the organic EL element 30 and the color filter 36 in the sub pixel 18 will be described with reference to FIG. 3.

As shown in FIG. 3, the pixel electrode 31 of the respective organic EL elements 30 is disposed on the plurality of sub pixels 18 that are arranged in a matrix shape in the X direction and the Y direction. In detail, the pixel electrode 31B of the organic EL element 30B is arranged on the sub pixel 18B, the pixel electrode 31G of the organic EL element 30G is arranged on the sub pixel 18G, and the pixel electrode 31R of the organic EL element 30R is arranged on the sub pixel 18R. The respective pixel electrodes 31 (31B, 31G, 31R) are formed in a substantially rectangular shape in planar view, and a longitudinal direction is disposed along the Y direction.

The organic EL apparatus 100 has a configuration in which three sub pixels 18B, 18G, and 18R arranged in the X direction are displayed as one pixel 19. The arrangement pitch of the sub pixels 18B, 18G, and 18R in the X direction is, for example, 10 μm or less. Accordingly, the organic EL apparatus 100 is a high-definition light emitting device.

An insulation film 28 is formed to cover an outer edge of each pixel electrode 31B, 31G, and 31R. In planar view, opening portions 28KB, 28KG, and 28KR with substantially a rectangular shape are formed on the pixel electrodes 31B, 31G, and 31R on the insulation film 28. Within the opening portions 28KB, 28KG, and 28KR, the respective pixel electrodes 31B, 31G, and 31R are exposed. Note that, the shape of the opening portions 28KB, 28KG, and 28KR is not limited to a substantial rectangular shape, and may be a track shape in which, for example, a short side is an arc shape.

In the sub pixels 18B, 18G, and 18R, a region in which the opening portions 28KB, 28KG, and 28KR are provided is a light emission region EM in which the organic EL elements 30B, 30G, and 30R emit light. In the sub pixels 18B, 18G, and 18R, a region in which the insulation film 28 is provided is a light emission suppression region S in which light emission of the organic EL elements 30B, 30G, and 30R is suppressed. Accordingly, in the sub pixels 18B, 18G, and 18R, the periphery of the light emission region EM is the light emission suppression region S.

The color filter 36 is disposed on the sub pixels 18B, 18G, and 18R. The color filter 36 is configured by a blue (B) colored layer 36B, a green (G) colored layer 36G, and a red (R) colored layer 36R. In detail, the colored layer 36B is disposed with respect to the plurality of sub pixels 18B that are arranged in the Y direction, the colored layer 36G is disposed with respect to the plurality of sub pixels 18G, and the colored layer 36R is disposed with respect to the plurality of sub pixels 18R.

That is, the colored layer 36B is arranged in the stripe shape extending in the Y direction so as to overlap with the pixel electrodes 31B (opening portion 28KB) that are arranged in the Y direction. The colored layer 36G is arranged in the stripe shape extending in the Y direction so as to overlap with the pixel electrodes 31G (opening portion 28KG) that are arranged in the Y direction. Similarly, the colored layer 36R is arranged in the stripe shape extending in the Y direction so as to overlap with the pixel electrodes 31R (opening portion 28KR) that are arranged in the Y direction.

Light Emitting Element Structure

Figure 4:
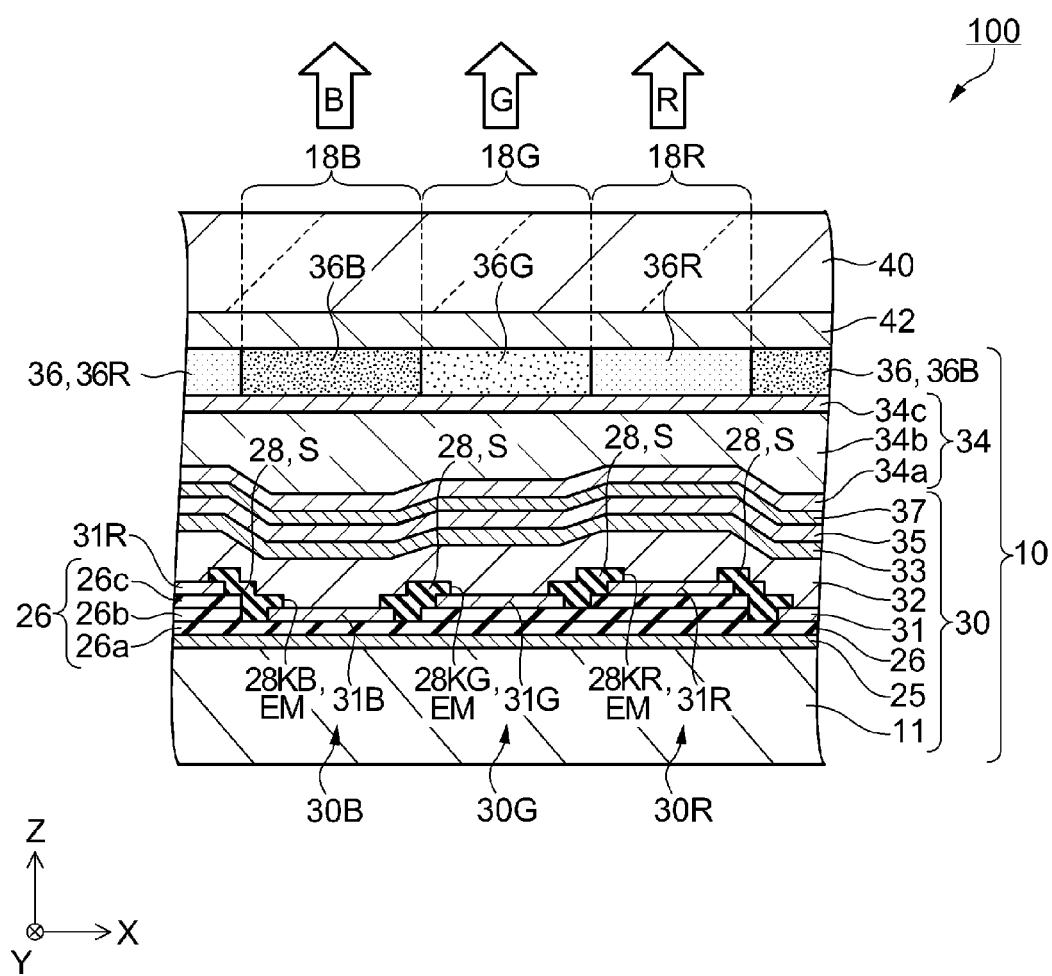
FIG. 4 is a schematic sectional view illustrating a structure of the organic EL element along line IV-IV in FIG. 3.

Next, the structure of the organic EL element 30 will be described as the light emitting element with reference to FIG. 4. FIG. 4 is a schematic sectional view illustrating the structure of the organic EL element along line IV-IV in FIG. 3.

As shown in FIG. 4, the organic EL apparatus 100 has the element substrate 10 and the protective substrate 40 that are disposed facing via the filler 42. The filler 42 has a role of adhering the element substrate 10 and the protective substrate 40, and is configured by, for example, epoxy resin, an acrylic resin, or the like that have transmissivity.

The element substrate 10 is provided with the organic EL element 30, and the sealing layer 34 and the color filter 36 that are laminated on the organic EL element 30. The organic EL element 30 is provided with a base material 11 as a substrate in the invention, and a light reflection layer 25, a light transmitting layer 26, the pixel electrode 31 as the first electrode, the light emitting function layer 32, the electron injection layer 33, the counter electrode 35 as the second electrode, and the adsorption layer 37 are laminated in order in the Z direction on the base material 11.

For example, the base material 11 is a semiconductor substrate of silicon and the like. As described above, the scanning lines 12, the data lines 13, power supply lines 14, the data line driving circuit 15, the scanning line driving circuit 16, a pixel circuit 20 (switching transistor 21, storage capacitor 22, and driving transistor 23), and the like are formed on the base material 11 using a known technology (refer to FIG. 2). In FIG. 4, illustration of a wiring or a circuit configuration is omitted.

Note that, the base material 11 is not limited to a semiconductor substrate such as silicon, and may be, for example, a substrate such as quartz or glass. In other words, a transistor that configures the pixel circuit 20 may be a MOS type transistor that has an active layer in the semiconductor substrate, and may be a thin film transistor or a field effect transistor that is formed on the substrate such as quartz or glass.

The light reflection layer 25 is disposed to extend over the sub pixels 18B, 18G, and 18R, and light that is emitted from the organic EL elements 30B, 30G, and 30R of each sub pixel 18B, 18G, and 18R is reflected. As the formation material of the light reflection layer 25, it is preferable to use, for example, aluminum (Al), silver (Ag), and the like that is able to realize high reflectance in a visible light region.

The light transmitting layer 26 is provided on the light reflection layer 25. The light transmitting layer 26 is configured by a first insulation film 26a, a second insulation film 26b, and a third insulation film 26c. The first insulation film 26a is disposed to extend over the sub pixels 18B, 18G, and 18R on the light reflection layer 25. The second insulation film 26b is laminated on the first insulation film 26a and is disposed to extend over the sub pixel 18G and the sub pixel 18R. The third insulation film 26c is laminated on the second insulation film 26b and is disposed on the sub pixel 18R.

That is, the light transmitting layer 26 of the sub pixel 18B is configured by the first insulation film 26a, the light transmitting layer 26 of the sub pixel 18G is configured by the first insulation film 26a and the second insulation film 26b, and the light transmitting layer 26 of the sub pixel 18R is configured by the first insulation film 26a, the second insulation film 26b, and the third insulation film 26c. Accordingly, the thickness of the light transmitting layer 26 becomes larger in order of the sub pixel 18B, the sub pixel 18G, and the sub pixel 18R. A transparent material in a visible light range of, for example, silicon oxide, silicon nitride, titanium oxide, and the like is used in the first insulation film 26a, the second insulation film 26b, and the third insulation film 26c.

The pixel electrode 31 is provided on the light transmitting layer 26. For example, the pixel electrode 31 is configured from a transparent conductive film such as an indium tin oxide (ITO) film or the like, and is formed in an island shape in each sub pixel 18. The insulation film 28 is disposed to cover the peripheral edge portion of each pixel electrode 31B, 31G, and 31R. As described above, the opening portion 28KB is formed on the pixel electrode 31B, the opening portion 28KG is formed on the pixel electrode 31G, and the opening portion 28KR is formed on the pixel electrode 31R on the insulation film 28. The insulation film 28 is made from, for example, silicon oxide.

In a part in which the opening portions 28KB, 28KG, and 28KR are provided, the pixel electrodes 31 (31B, 31G, 31R) and the light emitting function layer 32 are connected, the positive hole is supplied from the pixel electrode 31 to the light emitting function layer 32, and the light emitting function layer 32 emits light. In the region in which the insulation film 28 is provided, supply of the positive hole from the pixel electrode 31 to the light emitting function layer 32 is suppressed, and light emission of the light emitting function layer 32 is suppressed. That is, as described above, in the sub pixels 18B, 18G, and 18R, the region in which the opening portions 28KB, 28KG, and 28KR are provided is the light emission region EM, and the region in which the insulation film 28 is provided is the light emission suppression region S.

The light emitting function layer 32 is disposed to cover the whole region of the display region E (refer to FIG. 1) that extends over the sub pixels 18B, 18G, and 18R. The light emitting function layer 32 has, for example, a positive hole injection layer, a positive hole transport layer, an organic light emitting layer, an electron transport layer, and the like laminated in that order in the Z direction. The organic light emitting layer emits light of a wavelength range from blue to red. The organic light emitting layer may be formed of a single layer, for example, includes a blue light emitting layer, a green light emitting layer, and a red light emitting layer, and may be configured by a plurality of layers that include the blue light emitting layer and a yellow light emitting layer that obtains light emission that includes the wavelength range of red (R) and green (G).

The electron injection layer 33 is disposed to cover the light emitting function layer 32. The electron injection layer 33 improves electron injection efficiency from the counter electrode 35 to the light emitting function layer 32, and functions to emit light of the light emitting function layer 32 at low voltage. It is desirable that a potential barrier between the counter electrode 35 and the light emitting function layer 32 in the negative electrode is small in order to improve electron injection efficiency to the light emitting function layer 32. In general, as the electron injection layer 33, a halogenide (in particular, fluoride), oxide, or the like of an element (alkali metal, alkaline earth metal, and the like) is used in which a work function is low such as LiF, $Li_2O$, Liq, MgO, and $CaF_2$. A detailed configuration of the electron injection layer 33 in the embodiment will be described later.

The counter electrode 35 is disposed to cover the electron injection layer 33. Since the counter electrode 35 does not function only as an electrode and configures an optical resonator structure described below with the light reflection layer 25, the counter electrode 35 is configured to be provided with transmissivity and light reflectivity (has semi-transmissive reflectance) to serve as the semi-transmissive reflective film, and the thickness is controlled. As the main component of the counter electrode 35, Ag which has a small light absorption rate in the visible light region is suitable. By using Ag as the main component, loss (absorption) of light due to the counter electrode 35 is suppressed to be small, and it is possible to improve brightness of the organic EL element 30.

However, Ag has a large work function and is not a reductive material. In addition, when the counter electrode 35 is configured by only Ag, deterioration of power supply performance is generated by reducing film quality due to aggregation of Ag atoms. Therefore, it is desirable to use Ag and a reductive material in a mixture as a material of the counter electrode 35 since electrical characteristics of the electrode is suitable. A detailed configuration of the counter electrode 35 in the embodiment will be described later.

The adsorption layer 37 is disposed to cover the counter electrode 35. The adsorption layer 37 functions such that moisture or oxygen that infiltrates from outside the organic EL element 30 is adsorbed and does not reach up to the counter electrode 35. A material (for example, Mg or Al) that easily reacts with moisture or oxygen is used as the material of the adsorption layer 37. A detailed configuration of the adsorption layer 37 in the embodiment will also be described later.

Note that, influence of the light transmitting layer 26 that has different thicknesses provided on a lower layer is received and concavities and convexities are generated on a front surface of the organic EL element 30 (adsorption layer 37). In more detail, in a part that overlaps with the light emission region EM within the opening portions 28KB, 28KG, and 28KR in planar view, since the thickness of the light transmitting layer 26 is substantially uniform, the front surface of the organic EL element 30 (adsorption layer 37) is substantially flat. Meanwhile, in a part that overlaps with the light emission suppression region S in which the insulation film 28 on the periphery of the light emission region EM is disposed in planar view, a step is generated due to the thicknesses of the light transmitting layer 26 being different.

The sealing layer 34 is disposed to cover the organic EL element 30 (adsorption layer 37). The sealing layer 34 is configured by a first sealing layer 34a, a flattening layer 34b, and a second sealing layer 34c are laminated in order in the Z direction. The first sealing layer 34a and the second sealing layer 34c are a passivation film that has a barrier property with respect to moisture or oxygen, and are formed using an inorganic material. A material through which moisture, oxygen, or the like tend not pass, for example, silicon oxide, silicon nitride, silicon oxynitride, aluminum oxide, and the like are used as the inorganic material.

A vacuum disposition method, an ion plating method, a sputtering method, a CVD method, and the like are given as a method for forming the first sealing layer 34a and the second sealing layer 34c. In the point of tending to impart damage such as heat to the organic EL element 30, it is desirable to adopt the vacuum disposition method or the ion plating method. The thickness of the first sealing layer 34a and the second sealing layer 34c is, for example, approximately 50 nm to 1000 nm and is preferably approximately 200 nm to 400 nm such that cracks and the like tend to occur during film formation and transmittance is obtained.

The flattening layer 34b is formed laminated on the first sealing layer 34a to cover the organic EL element 30 (adsorption layer 37). Concavities and convexities on the front surface of the organic EL element 30 that are generated by receiving influence of the light transmitting layer 26 that has different thicknesses is reflected on the front surface of the first sealing layer 34a. In addition, in the light emission suppression region S in which the step is generated on the front surface of the organic EL element 30, defects (pin holes and cracks) may be generated during film formation of the first sealing layer 34a.

The flattening layer 34b mitigates concavities and convexities on the front surface of the first sealing layer 34a, covers defects (pin holes and cracks), foreign matter, or the like during film formation of the first sealing layer 34a, and forms a substantially flat surface. In order to mitigate concavities and convexities on the front surface of the first sealing layer 34a, it is preferable to form the flattening layer 34b at a thickness of, for example, approximately 1 μm to 5 μm. Due to this, influence of the concavities and convexities tends to be received by the color filter 36 that is formed on the sealing layer 34 (second sealing layer 34c).

The flattening layer 34b has transmittance, and is able to form a resin material of any of, for example, heat or ultraviolet curable epoxy resin, acrylic resin, urethane resin, and silicone resin by coating and post-curing by dissolving in an organic solvent or liquid. Note that, the flattening layer 34b may be formed using a coating type of inorganic material (silicon oxide and the like).

The color filter 36 is disposed on the sealing layer 34. The color filter 36 is configured by the colored layers 36B, 36G, and 36R that are formed by photolithography and the like using a photosensitive resin material that includes color material of blue (B), green (G), and red (R) corresponding to the sub pixels 18B, 18G, and 18R. The colored layers 36B, 36G, and 36R of the color filter 36 function to increase color purity of each color of light of blue (B), green (G), and red (R) emitted to the protective substrate 40 side due to light being transmitted in a peak wavelength range that is extracted from each sub pixel 18 using the optical resonator structure described below.

Optical Resonator Structure

Next, the optical resonator structure that has the organic EL apparatus 100 according to the embodiment will be described with reference to FIG. 4. The organic EL apparatus 100 according to the embodiment has the optical resonator structure between the light reflection layer 25 and the counter electrode 35. In the organic EL apparatus 100, light generated by the light emitting function layer 32 is repeatedly reflected between the light reflection layer 25 and the counter electrode 35, intensity of light of a specific resonator (optical resonator) is amplified corresponding to an optical distance between the light reflection layer 25 and the counter electrode 35, and each color of light of blue (B), green (G), and red (R) is emitted from the protective substrate 40 in the Z direction as display light.

In the embodiment, the light transmitting layer 26 has a role of adjusting the optical distance between the light reflection layer 25 and the counter electrode 35. As described later, the thickness of the light transmitting layer 26 becomes larger in order of the sub pixel 18B, the sub pixel 18G, and the sub pixel 18R. As a result, the optical distance between the light reflection layer 25 and the counter electrode 35 becomes larger in order of the sub pixel 18B, the sub pixel 18G, and the sub pixel 18R. The optical distance is able to be represented by the sum total of the product of the refractive index and thickness of each layer that is present between the light reflection layer 25 and the counter electrode 35.

For example, in the sub pixel 18B, the thickness of the light transmitting layer 26 is set such that the resonant wavelength (peak wavelength where luminance is maximum) is 470 nm. In the sub pixel 18G, the thickness of the light transmitting layer 26 is set such that the resonant wavelength is 540 nm. In the sub pixel 18R, the thickness of the light transmitting layer 26 is set such that the resonant wavelength is 610 nm.

As a result, blue color light (B) that has a peak wavelength of 470 nm is emitted from the sub pixel 18B, green color light (G) that has a peak wavelength of 540 nm is emitted from the sub pixel 18G, and red color light (R) that has a peak wavelength of 610 nm is emitted from the sub pixel 18R. In other words, the organic EL apparatus 100 has an optical resonator structure that amplifies the intensity of light of the specific wavelength, a blue light component is extracted from white light emitted by the light emitting function layer 32 in the sub pixel 18B, a green light component is extracted from white light emitted by the light emitting function layer 32 in the sub pixel 18G, and a red light component is extracted from white light emitted by the light emitting function layer 32 in the sub pixel 18R.

Note that, in place of the light transmitting layer 26, there may be a configuration in which the optical distance between the light reflection layer 25 and the counter electrode 35 is adjusted by the thicknesses of the pixel electrodes 31 (31B, 31G, 31R) being different from each other.

In such sub pixels 18B, 18G, and 18R, color purity of each color is increased by transmitting each color of light of blue (B), green (G), and red (R) emitted from the organic EL elements 30B, 30G, and 30R through the colored layers 36B, 36G, and 36R of the color filter 36.

Figure 5:
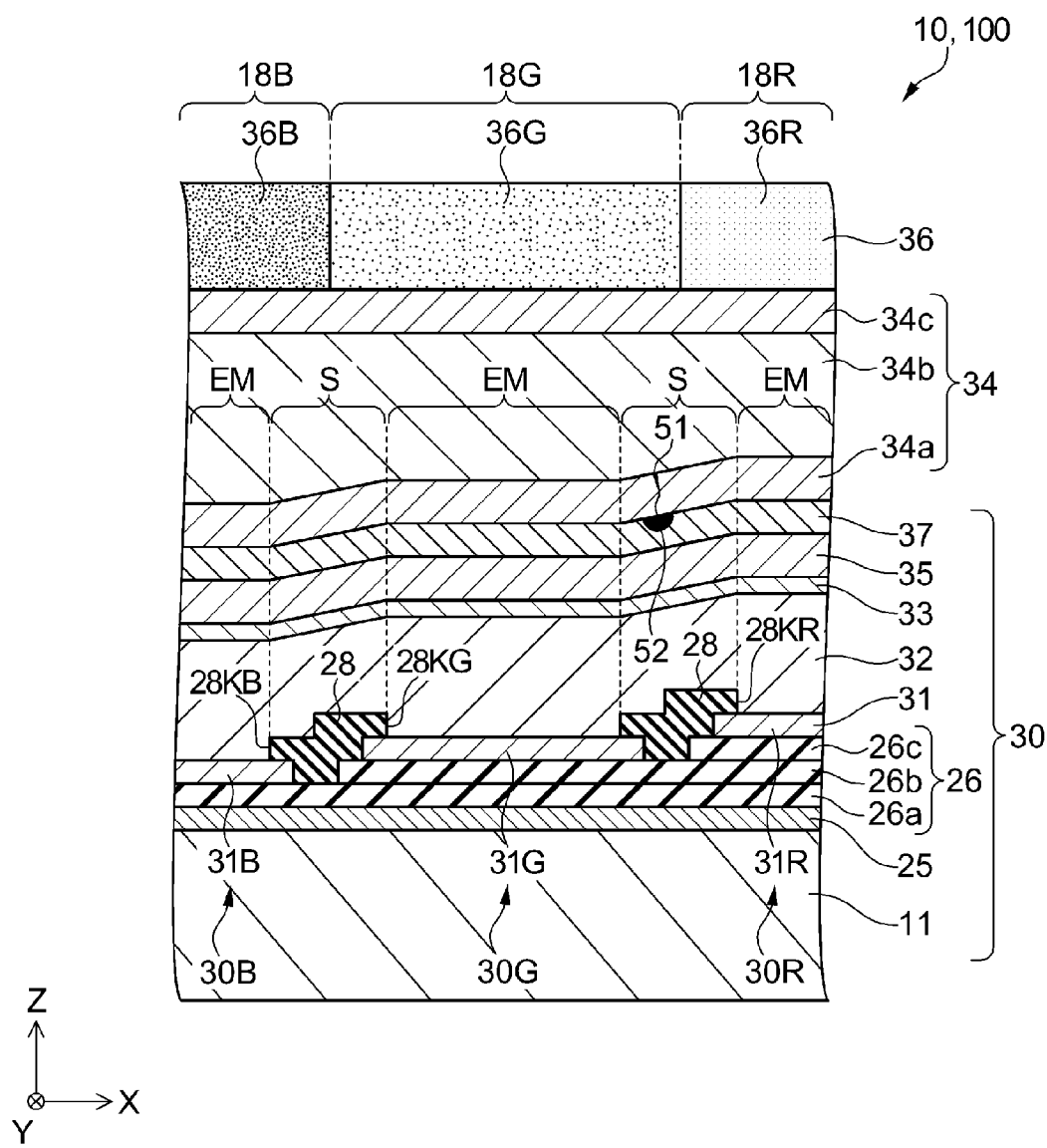
FIG. 5 is an enlarged sectional view illustrating a structure of the organic EL element according to the first embodiment.

Electron Injection Layer, Counter Electrode, and Adsorption Layer Detailed Configuration Next, the detailed configuration of the electron injection layer 33 that is provided with the organic EL element 30 according to the embodiment, the counter electrode 35, and the adsorption layer 37 will be described with reference to FIG. 5. FIG. 5 is an enlarged sectional view illustrating the structure of the organic EL element according to the first embodiment. FIG. 5 is a diagram in which a sectional view of FIG. 4 is partially enlarged.

The electron injection layer 33 according to the embodiment indicated in FIG. 5 is formed using lithium fluoride (LiF) that is a material which is stable in the atmosphere. In the embodiment, the counter electrode 35 and adsorption layer 37 include Mg that is a reductive material that reduces a material (Li compound) of the electron injection layer 33, the light emitting function layer 32 emits light at a lower voltage and increases intensity of the organic EL element 30 according to the amount of Mg contained in both. The thickness of the electron injection layer 33 is, for example, approximately 1 nm.

The counter electrode 35 according to the embodiment contains Ag and Mg that is a reductive material. Since the greater the amount of Ag that is contained in the counter electrode 35, the smaller the loss (absorption) of light and the brighter the light, it is possible to improve optical characteristics of the semi-transmissive reflective film. In addition, the greater the amount of Ag that is contained in the counter electrode 35, the more it is possible to improve current injection properties of the counter electrode 35. In the counter electrode 35 according to the embodiment, it is preferable to contain Ag with atomic ratio of 75% or more and contain Ag of 90% or more, and it is further preferable to contain Ag of 95% or more.

In the embodiment, the counter electrode 35 is formed using the vacuum disposition method of a vapor deposition method. A ratio of Ag and Mg that is contained in the counter electrode 35 is able to be adjusted according to a deposition velocity ratio of Ag and Mg when the counter electrode 35 is formed. For example, it is possible to respectively set the ratio of Ag that is contained in the counter electrode 35 to 75%, 90%, and 95% due to the deposition velocity ratio of Ag and Mg being set to 3:1, 9:1, and 20:1. When the deposition velocity ratios of Ag and Mg are set to 3:1 (Ag with atomic ratio of 75%) to 20:1 (Ag with atomic ratio of 95%), the possibility of the optical characteristic and the current injection properties being in a suitable state is indicated in FIGS. 2, 5, and 6 in Japanese Patent No. 5411469.

Figure 8:
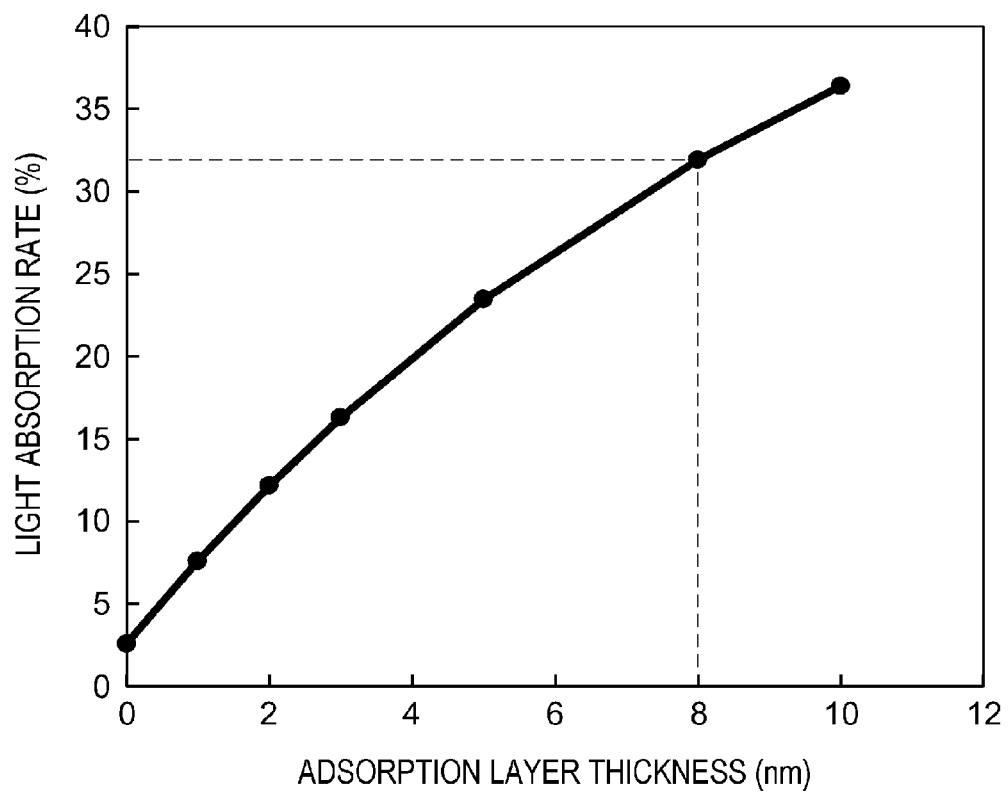
FIG. 8 is a graph illustrating a relationship between a thickness and a light absorption rate of the adsorption layer.

Meanwhile, when there is too much Ag contained in the counter electrode 35, power supply performance deteriorates by resistivity of the counter electrode 35 raising since film quality is reduced due to aggregation of Ag atoms in an island shape. In the embodiment, other than Ag, since Mg is contained in the counter electrode 35, it is possible to suppress reduction of the film quality due to aggregation of Ag atoms. In the embodiment, Ag contained in the counter electrode 35 has an atomic ratio of 98% or less. When the deposition velocity ratio of Ag and Mg is set to 50:1 (Ag with atomic ratio of 98%), reduction of the optical characteristic (luminance) and the power supply performance is indicated in FIGS. 4, 5, and 8 in Japanese Patent No. 5411469.

In this manner, in the embodiment, it is possible to reconcile improvement of optical characteristics of the semi-transmissive reflective film and improvement of electrical characteristics of the electrode in the counter electrode 35 by setting Ag contained in the counter electrode 35 in the range of atomic ratio of 75% to 98%. The thickness of the counter electrode 35 is, for example, approximately 15 nm. Note that, the counter electrode 35 may contain an element other than Ag and Mg.

However, when moisture or oxygen infiltrates in the counter electrode 35 with Ag as the main component, since Ag is extremely rich in reactivity, Ag contained in the counter electrode 35 reacts with the moisture or oxygen. By doing this, electron injection of the counter electrode 35 is reduced, and leads to reliability quality reduction in deterioration of a light emission characteristic and light emission service life of the organic EL element 30. The greater the amount of Ag that is contained in the counter electrode 35, the greater the influence on deterioration or reliability quality reduction of the light emission characteristic. Therefore, the adsorption layer 37 is provided in order for moisture or oxygen that infiltrates from outside the organic EL element 30 to be adsorbed and not reach up to the counter electrode 35.

The adsorption layer 37 according to the embodiment is formed of Mg. Mg is a material in which moisture or oxygen tend to react, and is suitable as the material of the adsorption layer 37. The adsorption layer 37 is formed using the vacuum disposition method in the same manner as the counter electrode 35. Since Mg is a material contained as the reductive material in the counter electrode 35, after Ag and Mg form a film of the counter electrode 35 as the material, it is possible to form a film of the adsorption layer 37 on the counter electrode 35 with only Mg as the material. Accordingly, it is possible to easily carry out a manufacturing process of the organic EL element 30, and it is possible to improve productivity of the organic EL element 30.

Figure 10:
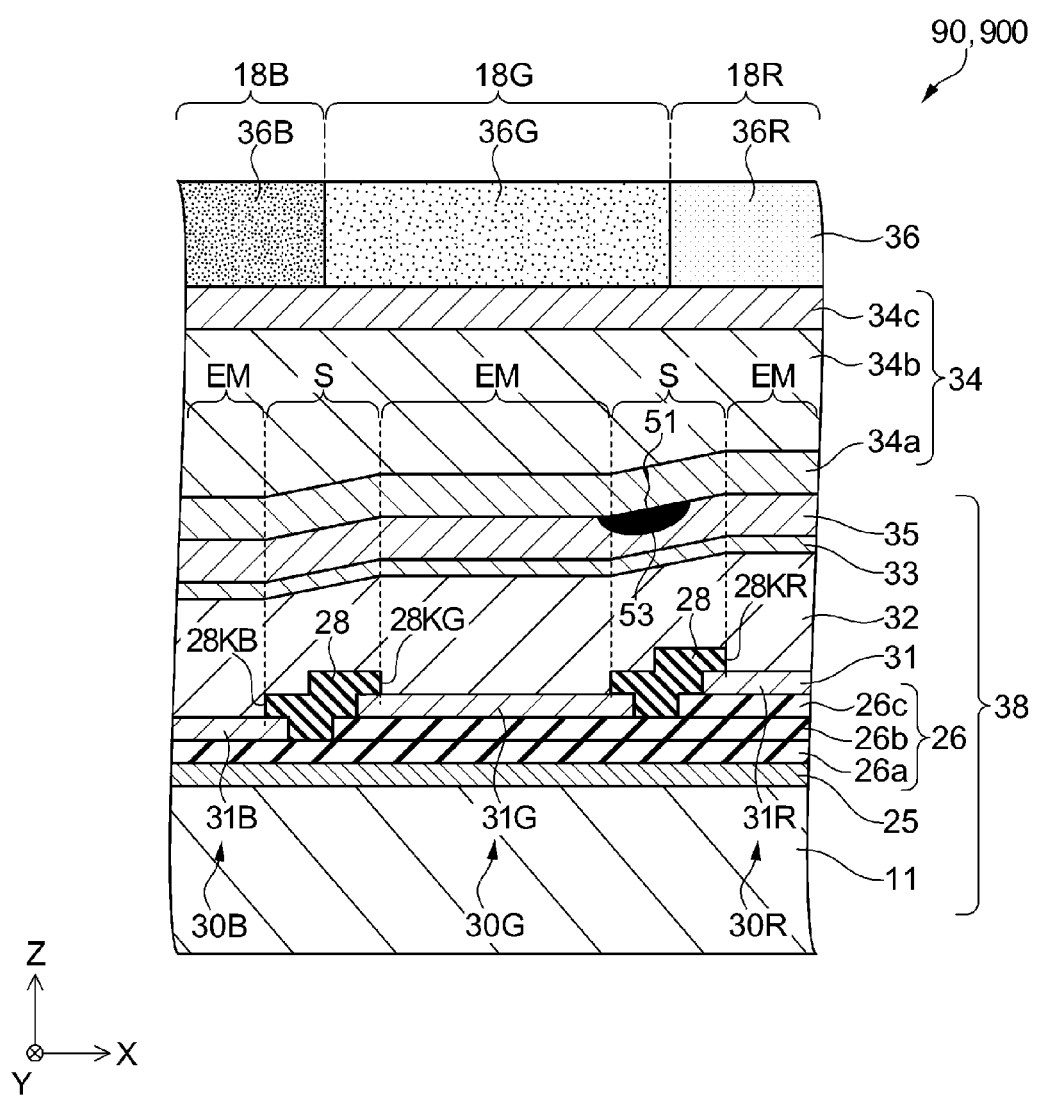
FIG. 10 is an enlarged sectional view illustrating a structure of the organic EL element according to a comparative example.

Here, an effect due to providing the adsorption layer 37 is described in comparison to a comparative example. FIG. 10 is an enlarged sectional view illustrating a structure of the organic EL element according to the comparative example. An element substrate 90 of an organic EL apparatus 900 that is provided with an organic EL element 38 according to the comparative example is indicated in FIG. 10. The organic EL element 38 according to the comparative example has the same configuration other than a point of not being provided with the adsorption layer 37 being different with respect to the organic EL element 30 according to the embodiment.

As shown in FIG. 10, in the light emission suppression region S between the light emission region EM of the sub pixel 18G and the light emission region EM of the sub pixel 18R, a case is assumed in which a crack 51 is generated caused by a step, foreign matter, or the like on the front surface of the organic EL element 38 in the first sealing layer 34a that covers the organic EL element 38 (counter electrode 35). In the flattening layer 34b that is formed by a resin material such as epoxy resin on the first sealing layer 34a, content of moisture or oxygen is reduced due to a dehydration process or film formation and the like under a nitrogen atmosphere, but it is difficult for moisture or oxygen to be nil.

When moisture or oxygen contained in the flattening layer 34b infiltrates up to the counter electrode 35 through the crack 51 of the first sealing layer 34a, moisture or oxygen react when Ag contained in the counter electrode 35 infiltrates in the light emission suppression region S. A reaction portion 53 that is formed within the counter electrode 35 by Ag reacting with moisture or oxygen is schematically indicated in FIG. 10. Since there is loss of electron injection of the counter electrode 35 in the reaction portion 53, when the reaction portion 53 is formed within the light emission region EM, the part is a dark point in which the light emitting function layer 32 does not generate light.

When moisture or oxygen that infiltrates in the light emission suppression region S spreads within the counter electrode 35, as shown in FIG. 10, the reaction portion 53 is enlarged from the light emission suppression region S to the light emission region EM of the sub pixel 18G. By doing this, since the dark spot in which the light emitting function layer 32 does not emit light is formed within the light emission region EM, in the sub pixel 18G, a phenomenon (hereinafter referred to as a pixel shrink) in which a region in which light is substantially emitted is smaller than within the light emission region EM is generated and brightness of the sub pixel 18G is reduced.

In this manner, when moisture or oxygen infiltrates in the counter electrode 35 and is spread within the counter electrode 35, brightness of the organic EL apparatus 900 is reduced due to pixel shrink being generated by enlarging the reaction portion 53. Then, when reaction of moisture or oxygen with Ag within the counter electrode 35 temporally proceeds leading to reliability quality reduction of the organic EL apparatus 900.

When the organic EL apparatus 900 is a high-definition light emitting device with a pixel arrangement pitch of the sub pixel 18 is 10 μm or less, the light emission region EM in each sub pixel 18 and the light emission suppression region S on the periphery thereof are small in comparison to a light emitting device with a larger arrangement pitch of the sub pixel 18. Therefore, since moisture or oxygen tends to spread in the light emission region EM when infiltrating the counter electrode 35, pixel shrink tends to be generated and reduction of brightness becomes more significant.

In contrast to this, in the organic EL apparatus 100 according to the embodiment, the adsorption layer 37 is provided on the counter electrode 35. FIG. 5 schematically indicates a case of moisture or oxygen that passes through the crack 51 of the first sealing layer 34a infiltrating the organic EL element 30 in the element substrate 10 of organic EL apparatus 100. In the organic EL element 30, since the counter electrode 35 is covered by the adsorption layer 37, Mg contained in the adsorption layer 37 reacts with moisture or oxygen, the reaction occurs that is indicated in Formula (2) or Formula (3) described later, and the reaction portion 52 is formed that is a part in which oxygen atoms within the adsorption layer 37 are adsorbed.

That is, even if moisture or oxygen infiltrates from outside the organic EL element 30, the infiltrated moisture or oxygen is adsorbed due to the reaction with Mg using the adsorption layer 37. Accordingly, even if the content of Ag contained in counter electrode 35 is high, since infiltration of moisture or oxygen to the counter electrode 35 is suppressed by the adsorption layer 37 and it is possible to suppress generation of pixel shrink, it is possible to suppress brightness reduction or reliability quality reduction of the organic EL element 30. As a result, it is possible to provide the organic EL apparatus 100 in which the brightness reliability quality is superior.

Here, the crack 51 of the first sealing layer 34a tends to be generated in the light emission suppression region S that has a step on the front surface of the organic EL element 30. Therefore, when moisture or oxygen that infiltrates within the adsorption layer 37 through the crack 51 reacts with Mg, the reaction portion 52 is formed in the light emission suppression region S. Accordingly, in the organic EL apparatus 100 in which the reaction portion 52 is formed in the adsorption layer 37 as indicated in FIG. 5, concentration of oxygen atoms contained in the adsorption layer 37 in the light emission suppression region S is higher than the concentration of oxygen atoms contained in the adsorption layer 37 in the light emission region EM.

Note that, here, a case is described in which moisture or oxygen contained in the flattening layer 34b is adsorbed more than the adsorption layer 37, but even in the unlikely event of a case where moisture or oxygen infiltrates from outside the sealing layer 34 (second sealing layer 34c), infiltration into the counter electrode 35 is suppressed since Mg contained in the adsorption layer 37 is adsorbed by reacting with infiltrated moisture or oxygen.

From the viewpoint of suppressing infiltration of moisture or oxygen into the counter electrode 35, it is considered that thickness of the adsorption layer 37 is preferably thick. However, when thickness of the adsorption layer 37 is thickened, since light loss (light absorption) increases due to the adsorption layer 37 with respect to light that is emitted from the light emitting function layer 32, brightness that is realized is impaired by setting the main component of the counter electrode 35 to Ag. Therefore, a suitable range of thickness of the adsorption layer 37 (upper limit and lower limit) will be described in comparison to examples and comparative examples.

Adsorption Layer Thickness Suitable Range

Figure 7:
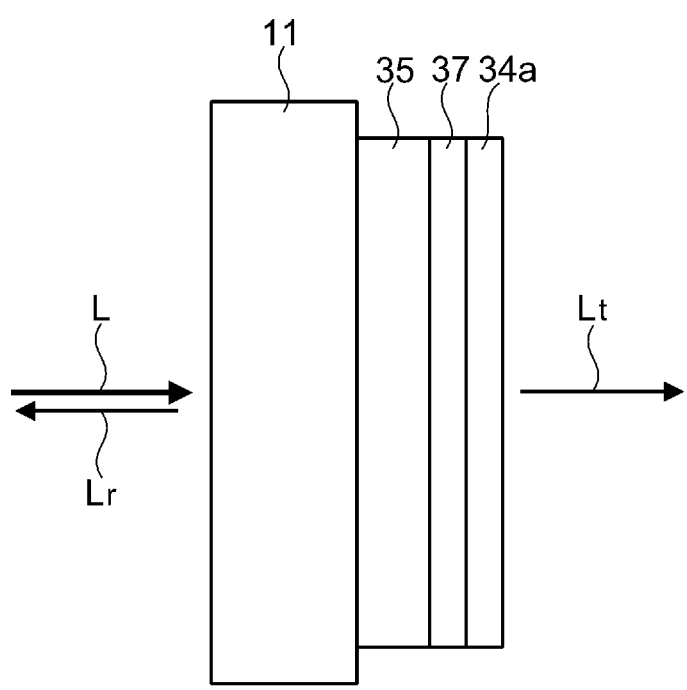
FIG. 7 is a diagram which describes a measurement method of a light absorption rate using an adsorption layer.

FIG. 6 is a table illustrating a configuration and test results of examples and comparative examples. FIG. 7 is a diagram which describes a measurement method of a light absorption rate using the adsorption layer. FIG. 8 is a graph illustrating a relationship between the thickness and a light absorption rate of the adsorption layer.

As shown in FIG. 6, in order to find the suitable range of thickness of the adsorption layer 37, two comparative examples and seven examples were prepared. Comparative Example 1 is different in a point of not being provided with the electron injection layer 33 and adsorption layer 37 with respect to the organic EL element 30 according to the embodiment and thickness of the counter electrode 35 is the same as 15 nm, but Ag contained in the counter electrode 35 is approximately 9.1% (during film formation, the deposition velocity ratio of Ag and Mg is 1:10).

Comparative Example 2 is only different in a point of not being provided with the adsorption layer 37 with respect to the organic EL element 30 according to the embodiment, and is the same in a point of being provided with the electron injection layer 33 with thickness of 1 nm that is configured by two layers of LiF and Mg and the counter electrode 35 with thickness of 15 nm including 90.9% of Ag (film is formed with the deposition velocity ratio of Ag and Mg of 10:1). Accordingly, Comparative Example 2 is different from Comparative Example 1 in a point of being provided with the electron injection layer 33 and a point of the ratio of Ag that is contained in the counter electrode 35 being high.

A number value (set to one) that references measurement results of luminance of Comparative Example 1 is indicated in the "RELATIVE LUMINANCE" column in FIG. 6. In addition, generation time is indicated in the "HIGH-TEMPERATURE TEST" column in FIG. 6 in a case where the organic EL apparatus is left under an atmosphere of 60° C. for 1000 hours and pixel shrink described above is generated, and "–" is indicated in a case where pixel shrink is not generated. Note that, the "HIGH-TEMPERATURE TEST" is a test in which reduction of reliability is accelerated by moisture that infiltrates through the crack 51 of the first sealing layer 34a, and for example, a test condition is set assuming a case in which an electronic apparatus is left that is provided with the organic EL apparatus inside an automobile under the blazing sun.

Relative luminance is 1.76 in Comparative Example 2 with respect to Comparative Example 1, the ratio of Ag that is contained in the counter electrode 35 in Comparative Example 2 being high and the electron injection layer 33 being provided is understood to contribute to improvement of brightness. Meanwhile, pixel shrink is generated in 230 hours in Comparative Example 2 with respect to pixel shrink not being generated in 1000 hours in Comparative Example 1, it is understood that pixel shrink tends to occur due to a high ratio of Ag that is contained in the counter electrode 35 reacting with moisture or oxygen.

Example 1 to Example 7 have the same configuration of the electron injection layer 33 and the counter electrode 35 as Comparative Example 2, but are different in the point of being provided with the adsorption layer 37. In addition, in Examples, 1, 2, 3, 4, 5, 6, and 7, thickness of the adsorption layer 37 is set to different respective values of 0.5 nm, 1 nm, 2 nm, 3 nm, 5 nm, 8 nm, and 10 nm.

Concerning relative luminance, Example 7 is lower than Comparative Example 1 and is 0.87 with respect to Example 1, but Example 1 to Example 6 are higher values than Comparative Example 1. As a result, the thinner the thickness of the adsorption layer 37, the higher the luminance (in other words, the thicker the thickness of the adsorption layer 37, the lower the luminance), it is understood that it is possible to realize higher luminance than Comparative Example 1 if thickness of the adsorption layer 37 is 8 nm or less.

Meanwhile, in the high-temperature test, pixel shrink is generated in 450 hours in Example 1, but pixel shrink is not generated in 1000 hours in Example 2 to Example 7. As a result, even if the ratio of Ag that is contained in the counter electrode 35 is high, pixel shrink tends not to be generated due to providing the adsorption layer 37, and if thickness of the adsorption layer 37 is 1 nm or more, it is understood that a function is realized of suppressing infiltration into the counter electrode 35 by adsorbing moisture or oxygen.

Next, an upper limit of thickness of the adsorption layer 37 will be considered. In the organic EL element 30 according to the embodiment, the optical resonator structure is formed between the light reflection layer 25 and the counter electrode 35. Since the adsorption layer 37 is formed on the counter electrode 35 that is a semi-transmissive reflective film, there is demand to reduce light loss (light absorption rate) with respect to light emitted from the optical resonator structure of the organic EL element 30, that is, light emitted from the counter electrode 35 in the adsorption layer 37.

Therefore, as shown in FIG. 7, the counter electrode 35, the adsorption layer 37, and the first sealing layer 34a are formed on the base material 11 and light loss is evaluated with respect to incident light L. The counter electrode 35 has a thickness of 15 nm with the deposition velocity ratio of Ag and Mg during film formation of 10:1 (content of Ag is 90.9%). The adsorption layer 37 is formed of Mg, and the thickness is set the same respectively in Example 2 to Example 7. In the first sealing layer 34a, a silicon nitride film is formed at a thickness of 500 nm using the CVD method.

A result in which light loss (light absorption rate) due to the adsorption layer 37 is measured in the configuration described above is indicated in FIG. 8. In FIG. 8, the horizontal axis is thickness (nm) of the adsorption layer 37 and the vertical axis is the light absorption rate (%). The light absorption rate is changed per 1 nm in a range in which the wavelength of the incident light L is 400 nm to 700 nm indicated in FIG. 7 in each thickness of the adsorption layer 37, and an average value of the rate (reflectance) of reflected light Lr and the rate (transmittance) of transmitted light Lt is subtracted from the incident light L that is set as 1 and calculated by Formula (1) below. In Formula (1) below, A is the light absorption rate, R (λ) is reflectance in a wavelength λ, and T (λ) is transmittance in the wavelength λ.

$$A = \frac{1}{n}\sum_{i=1}^{n}\{1 - R(\lambda_i) - T(\lambda_i)\} \quad (1)$$

As shown in FIG. 8, the thicker the thickness of the adsorption layer 37, the larger the light absorption rate (light loss) becomes. Mg that configures the adsorption layer 37 may be an element with a large absorption amount of light (that is, extinction coefficient and absorption coefficient). Due to the result of "RELATIVE LUMINANCE" in FIG. 6, if thickness of the adsorption layer 37 is 8 nm or less, higher luminance is obtained than Comparative Example 1, and when the thickness of the adsorption layer 37 is 10 nm, luminance is lower than Comparative Example 1. Accordingly, in a case where the material of the adsorption layer 37 is Mg, it is preferable that the upper limit of the thickness be 8 nm.

According to FIG. 8, the light absorption rate is approximately 32% when thickness of the adsorption layer 37 be 8 nm. Thereby, in order to obtain luminance of Comparative Example 1 or more, it is preferable that the light absorption rate of the adsorption layer 37 is 30% or less. Accordingly, in a case where the material of the adsorption layer 37 is another material, it is preferable that the upper limit of the thickness of the adsorption layer 37 be a thickness with the light absorption rate of 30%.

Next, the lower limit of the thickness of the adsorption layer 37 will be considered. As shown in FIG. 6, pixel shrink is generated in 230 hours in Comparative Example 2 in which the adsorption layer 37 is not provided, and pixel shrink is generated in 450 hours in Comparative Example 1 in which the thickness of the adsorption layer 37 is 0.5 nm. Then, pixel shrink is not generated in 1000 hours in Examples 2, 3, 4, 5, 6, and 7 in which the thickness of the adsorption layer 37 is 1 nm or more. Here, as described above, a case in considered in which moisture or oxygen that is contained in the flattening layer 34b infiltrates through the crack 51 of the first sealing layer 34a.

In Comparative Example 1, as shown in FIG. 10, since moisture or oxygen that is contained in the flattening layer 34b infiltrates up to the counter electrode 35 through the crack 51 of the first sealing layer 34a, it is considered that pixel shrink is generated. In addition, in Example 1, although moisture or oxygen that infiltrates from the flattening layer 34b through the crack 51 of the first sealing layer 34a is approximately adsorbed by the adsorption layer 37, it is considered that pixel shrink is generated since a part infiltrates up to the counter electrode 35. In Examples 2, 3, 4, 5, 6, and 7, it is considered that moisture or oxygen that infiltrates through the crack 51 is adsorbed by the adsorption layer 37 and infiltration to the counter electrode 35 is suppressed.

Mg which configures the adsorption layer 37 is an element that tends to react with moisture or oxygen. Here, in a case where Mg reacts with moisture (water), a reaction occurs that is indicated by Formula (2), in a case where Mg reacts with oxygen, a reaction occurs that is indicated by Formula (3), thereby the lower limit of thickness of the adsorption layer 37 is calculated as a trial by hypothesizing that moisture or oxygen is adsorbed by the adsorption layer 37.

$$Mg + 2H_2O \rightarrow Mg(OH)_2 + H_2 \quad (2)$$

$$2Mg + O_2 \rightarrow 2MgO \quad (3)$$

In a case where water indicated in Formula (2) is reacted, two water molecules (two oxygen atoms) are adsorbed by one Mg atom. In a case where oxygen indicated in Formula (3) is reacted, one oxygen atom is adsorbed by one Mg atom. Here, Mg atoms are adsorbed atoms, and the number of Mg atoms is defined as the number adsorbed atoms. Moisture (water) of 50 ppm is contained in the flattening layer 34b. Note that, moisture that is contained in the flattening layer 34b is approximately 10 ppm in the comparative examples and examples described above, and 50 ppm is a value that includes a larger margin than in reality.

A case where the flattening layer 34b is formed by acrylic resin or epoxy resin is taken as an example, and specific gravity of the flattening layer 34b is set as 1.2 g/cm³. When the thickness of the flattening layer 34b is 2.5 μm, molecular weight of water is 18, and Avogadro's constant is 6.02×10²³ mol⁻¹, it is possible to calculate the atom number of oxygen that is contained in the flattening layer 34b using Formula (4) below.

$$50\text{ ppm}\times1.2[\text{g/cm}^3]\times18/(6.02\times10^{23}[1/\text{mol}])\times2.5[\mu\text{m}]= 5.0\times10^{14}[1/\text{cm}^2] \quad (4)$$

Next, it is possible to calculate thickness of the adsorption layer 37 (Mg) in a case where the atom number of oxygen and the same number of Mg atoms that are calculated by Formula (4) are uniformly formed using Formula (5) below when the atomic weight of Mg is 24, and the specific gravity of Mg is 1.74 g/cm³.

$$5.0\times10^{14}[1/\text{cm}^2]\times24/1.74\text{ [g/cm}^3]/(6.02\times10^{23}[1/\text{mol}])= 0.11\text{ [nm]} \quad (5)$$

As a result of Formula (5), the lower limit of the thickness of the adsorption layer 37 based on the trial calculation described above is 0.11 nm. From an evaluation result of the example indicated in FIG. 6, pixel shrink is not generated at the thickness of the adsorption layer 37 of 1 nm or more, but since pixel shrink is generated at the thickness of the adsorption layer 37 of 0.5 nm, in a case where the material of the adsorption layer 37 is Mg, it is preferable that the lower limit of the thickness of the adsorption layer 37 is 1 nm. The value is approximately 9.1 times 0.11 nm of the trial calculation described above.

It is considered that a difference of the thickness based on the trial calculation described above and the thickness based on the evaluation result of the example causes formation of a path through which moisture or oxygen is not spread locally (in a thickness direction) in a horizontal direction within the adsorption layer 37 and thickness of the adsorption layer 37 being not uniform.

As a result, it is desirable that the number of adsorbed atoms (Mg atoms) that are contained in the adsorption layer 37 is at least 10 times or more and preferably 20 times or more with respect to the number of adsorbed atoms under the premise that thickness is 0.11 nm based on the trail calculation described above. Accordingly, in a case where the material of the adsorption layer 37 is another material, it is preferable that the lower limit of the thickness of the adsorption layer 37 is a thickness in which the adsorbed atoms of ten times the number of water molecules or oxygen atoms that are contained in the flattening layer 34b are contained, and is a thickness in which the adsorbed atoms of 20 times or more of the number of water molecules or oxygen atoms that are contained in the flattening layer 34b are contained.

Note that, since the material of the adsorption layer 37 in the example described above is Mg with a relatively large light absorption coefficient, the thickness of the adsorption layer 37 is preferably thin in a range in which a function is realized of adsorbing moisture or oxygen. In more detail, the thickness of the adsorption layer 37 is thinner than the thickness of the counter electrode 35, but it is preferable to suppress extraction efficiency reduction of light that is emitted from the optical resonator structure of the organic EL element 30 (light that is emitted from the counter electrode 35).

Second Embodiment
Electronic Apparatus

Figure 9:
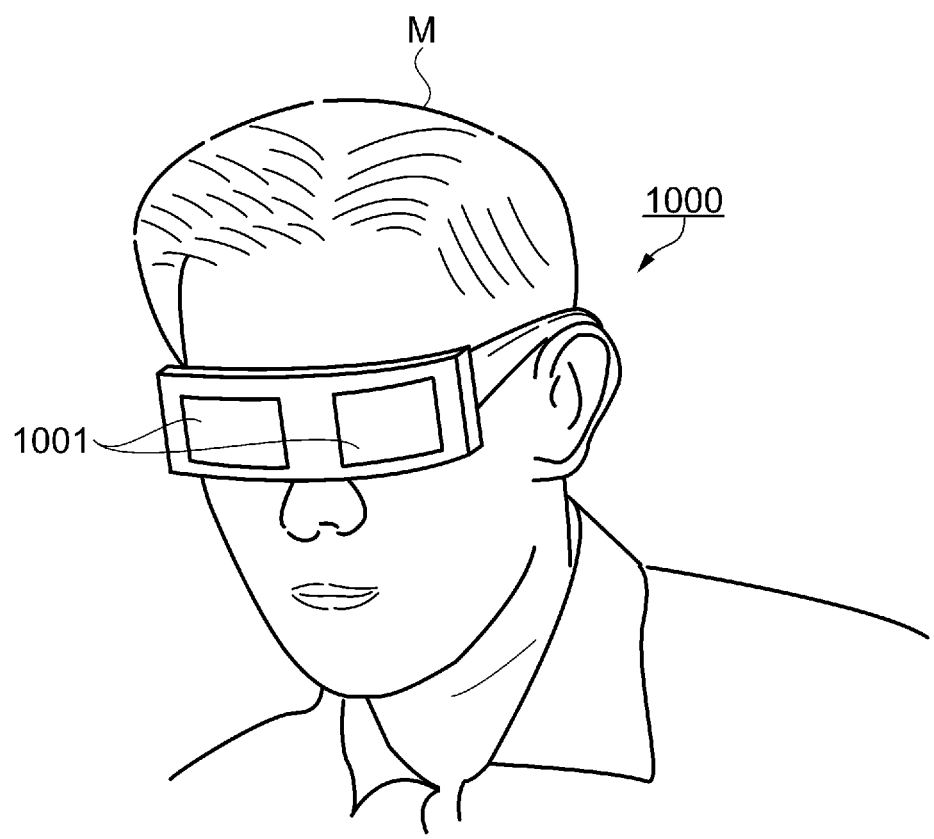
FIG. 9 is a schematic view illustrating a configuration of a head mounted display as an electronic apparatus according to a second embodiment.

Next, an electronic apparatus according to a second embodiment will be described with reference to FIG. 9. FIG. 9 is a schematic view illustrating a configuration of a head mounted display as an electronic apparatus according to the second embodiment.

As shown in FIG. 9, a head mounted display (HMD) 1000 according to the second embodiment is provided with two display portions 1001 which are provided to correspond to left and right eyes. An observer M is able to see characters, images, and the like which are displayed on the display portions 1001 by mounting the head mounted display 1000 on their head as glasses. For example, if an image is displayed taking into account a parallax in the left and right display portions 1001, it is also possible to enjoy viewing three-dimensional moving images.

The organic EL apparatus 100 according to the first embodiment is mounted on the display portions 1001. Accordingly, it is possible to provide a small light weight head mounted display 1000 that has display quality that is superior in viewing angle characteristics with high color purity, and in particular, a see-through type head mounted display 1000 is suitable.

The head mounted display 1000 is not limited to a configuration in which there are two display portions 1001, and may be configured to be provided with one display portion 1001 that corresponds to either left or right.

Note that, the electronic apparatus in which the organic EL apparatus 100 is mounted according to the first embodiment is not limited to the head mounted display 1000. As the electronic apparatus in which the organic EL apparatus 100 is mounted, for example, an electronic apparatus is given that has a display portion such as a personal computer or portable information terminal, a navigator, a viewer, and a head-up display.

The embodiment described above essentially illustrates an aspect of the invention, and is able to be arbitrarily modified and applied within the range of the invention. For example, the examples below are considered.

Modification Example 1

In the first embodiment, the material of the adsorption layer 37 that is provided with the organic EL element 30 is Mg, but the invention is not limited to the aspect. The material of the adsorption layer 37 (reductive material that reduces the material of the electron injection layer 33) may be a metal other than Al. Al is superior in reduction of an Li compound, treatment during manufacture is comparatively easy, and it is possible to easily use a vapor deposition method such as deposition. In addition, the material of the adsorption layer 37 may be an organic material. In a case where the organic material is used in the material of the adsorption layer 37, it is preferable that the absorption coefficient of light is small, and there is the organic material that has a water-absorbing property. Note that, in a case where the organic material is used in the material of the adsorption layer 37, when the lower value of the thickness of the adsorption layer 37 is set, it may be considered that the number of adsorbed atoms that are contained in the adsorption layer 37 is replaced with the number of adsorbed molecules.

Modification Example 2

In the first embodiment, in the organic EL apparatus 100, light emitting pixels that are provided in the display region E is not limited to the sub pixels 18B, 18G, and 18R that correspond to light emission of blue (B), green (G), and red (R). For example, a sub pixel 18Y may be provided that obtains light emission of yellow (Y) other than the three colors described above. Thereby, it is possible to further increase color reproducibility. In addition, sub pixels 18 of two colors out of the three colors described above may be provided.

The entire disclosure of Japanese Patent Application No. 2016-063257, filed Mar. 28, 2016 is expressly incorporated by reference herein.

What is claimed is:

1. A light emitting element comprising:
a first electrode;
a light emitting function layer that is formed on the first electrode;
an electron injection layer formed on the light emitting function layer; and
a second electrode that is formed on the electron injection layer and that has semi-transmissive reflectivity,
wherein the second electrode contains a reductive material that reduces material of the electron injection layer and Ag with atomic ratio of 75% or more, and
an adsorption layer is formed on the second electrode, a thickness of the adsorption layer being 1 nm or more, and being thinner than a thickness of the second electrode.

2. The light emitting element according to claim 1, wherein a material of the adsorption layer is the same material as the reductive material.

3. A light emitting device,
wherein the light emitting element according to claim 2 is provided in each pixel, and a sealing layer is provided that is formed to cover the light emitting element.

4. An electronic apparatus comprising:
the light emitting device according to claim 3.

5. The light emitting element according to claim 1,
wherein the material of the adsorption layer is Mg or Al.

6. A light emitting device,
wherein the light emitting element according to claim 5 is provided in each pixel, and a sealing layer is provided that is formed to cover the light emitting element.

7. An electronic apparatus comprising:
the light emitting device according to claim 6.

8. The light emitting element according to claim 1,
wherein a light absorption rate of the adsorption layer is 30% or less.

9. A light emitting device,
wherein the light emitting element according to claim 8 is provided in each pixel, and a sealing layer is provided that is formed to cover the light emitting element.

10. An electronic apparatus comprising:
the light emitting device according to claim 9.

11. The light emitting element according to claim 1,
wherein Ag that is contained in the second electrode has atomic ratio of 98% or less.

12. A light emitting device,
wherein the light emitting element according to claim 11 is provided in each pixel, and a sealing layer is provided that is formed to cover the light emitting element.

13. A light emitting device,
wherein the light emitting element according to claim 1 is provided in each pixel, and a sealing layer is provided that is formed to cover the light emitting element.

14. The light emitting device according to claim 13,
wherein the sealing layer includes
a first sealing layer,
a flattening layer made from an organic material that is laminated on the first sealing layer, and
a second sealing layer that is laminated on the flattening layer.

15. The light emitting device according to claim 13,
wherein arrangement pitch of the pixels is 10 μm or less.

16. An electronic apparatus comprising:
the light emitting device according to claim 13.

* * * * *